United States Patent
Chow et al.

(10) Patent No.: US 7,144,797 B2
(45) Date of Patent: Dec. 5, 2006

(54) SEMICONDUCTOR DEVICE HAVING MULTIPLE-ZONE JUNCTION TERMINATION EXTENSION, AND METHOD FOR FABRICATING THE SAME

(75) Inventors: Tat-Sing Paul Chow, Niskayuna, NY (US); Peter Losee, Clifton Park, NY (US); Santhosh Balachandran, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 10/949,982

(22) Filed: Sep. 24, 2004

(65) Prior Publication Data
US 2006/0068571 A1    Mar. 30, 2006

(51) Int. Cl.
*H01L 21/22* (2006.01)
*H01L 21/425* (2006.01)
*H01L 21/332* (2006.01)

(52) U.S. Cl. ........................ 438/549; 438/133; 438/514
(58) Field of Classification Search ................ 257/660; 438/551, 948, 950, 741, 6, 953
See application file for complete search history.

(56) References Cited
U.S. PATENT DOCUMENTS 4,927,772 A * 5/1990 Arthur et al. ............... 438/140
4,985,374 A * 1/1991 Tsuji et al. ................. 438/723
6,309,952 B1 10/2001 Ridley et al.
6,514,857 B1 * 2/2003 Naik et al. .................. 438/638
2003/0224612 A1 12/2003 Merrett et al.

OTHER PUBLICATIONS

Xiaokun Wang et al., "Optimization of JTE Edge Terminations for 10 kV Power Devices in 4H-SiC," ICSCRM, 2003.
N. Ramungul et al., "Design and Simulation of 6-H-Sic UMOS FET and IGBT for High Temperature Power Electronics Applications," Proceedings of International Conf. on Silicon Carbide and Related Materials, pp. 773-176, 1996.
D. Peters et al., "Characterization of Fast 4.5kV Sic p-n diodes," Proceedings of International Symposium on Power Semiconductor Devices & ICs, pp. 241-244, 2000.

(Continued)

*Primary Examiner*—Michael Lebentritt
*Assistant Examiner*—Cheung Lee
(74) *Attorney, Agent, or Firm*—Wolf, Greenfield & Sacks, P.C.

(57) ABSTRACT

A semiconductor device includes a graded junction termination extension. A method for fabricating the device includes providing a semiconductor layer having a pn junction, providing a mask layer adjacent to the semiconductor layer, etching the mask layer to form at least two laterally adjacent steps associated with different mask thicknesses and substantially planar step surfaces, and implanting a dopant species through the mask layer into a portion of the semiconductor layer adjacent to the termination of the pn junction. The semiconductor layer is annealed to activate at least a portion of the implanted dopant species to form the graded junction termination extension.

17 Claims, 4 Drawing Sheets

OTHER PUBLICATIONS

J. Fedison et al., "Electrical Characteristics of 4.5 kV Implanted Anode 4H-Sic p-i-n Junction Rectifiers," IEEE Electron Device Letters, vol. 22, pp. 130-132, 2001.

H.S. Kim et al., "A Lightly Doped Shallow Junction Extension for the High Breakdown Voltage Double Diffusion Process using the Taper Si02 Mask," Proceedings of International Symposium on Power Semiconductor Devices & IC's, pp. 335-339, 1995.

Y. Sugawara et al., "12-19kV 4H-Sic Pin Diodes with Low Power Loss," Proceedings Ofhternational Symposium on Power Semiconductor Devices & ICs, pp. 27-30, 2001.

R. Stengl et al., "Variation of Lateral Doping as a Field Terminator for High-Voltage Power Devices," IEEE Transactions on Electron Devices, vol. ED-33, pp. 426-428, 1986.

J.N. Merrett, et al., "Fabrication of Self-Aligned Graded Junction Termination Extensions with Applications to 4H-Sic p-n Diodes," Journal of Electronic Materials, vol. 31, pp. 635-639, 2002.

V.A.K. Temple, "Junction Termination Extension (JTE), A New Technique For Increasing Avalanche Breakdown Voltage and Controlling Surface Electric Fields in p-n Junctions," International Electron Devices meeting, pp. 423-426, 1977.

\* cited by examiner

SEMICONDUCTOR DEVICE HAVING MULTIPLE-ZONE JUNCTION TERMINATION EXTENSION, AND METHOD FOR FABRICATING THE SAME

FEDERALLY SPONSORED RESEARCH

This invention was made with Government support under DARPA Contract No. DAAD 19-02-1-0246, and NSF-ERC Contract No. EEC-9731677. The Government may have certain rights to this invention.

BACKGROUND OF INVENTION

1. Field of Invention

The invention is related to semiconductor device structures and fabrication methods, and, more particularly, to high power devices and their fabrication.

2. Discussion of Related Art

The reverse-biased pn junctions in high-voltage semiconductor devices can exhibit 15 relatively low breakdown voltages due to electric field concentration at the termination of the pn junction. To mitigate this problem, some high-voltage devices include junction termination extensions (JTEs) that reduce the magnitude of field concentration. A JTE can extend laterally from a junction to spread a field over a larger area, and thus increase a voltage at which avalanche breakdown may occur.

The laterally varying charge within a JTE can improve the blocking performance of the semiconductor junction. The improved junctions are less prone to high voltage breakdown and current leakage when the junction is reverse-biased.

A JTE can be fabricated though use of ion implantation of dopant into areas of a device adjacent to a pn junction termination. In materials where diffusion of dopants is practical (such as silicon), a uniform implant into an area next to a junction termination can be used along with a drive-in step at elevated temperature to distribute the dopant away from the junction termination.

Silicon carbide (SiC) is recognized as well suited to high voltage, high temperature, and high power applications. With the development of power devices and power electronics, silicon-based power devices are reaching their material limits. Wide band gap materials, such as SiC, are therefore viewed as an alternative for power device and electronics applications, particularly for extreme environments. SiC can be superior to silicon because of its wide band-gap, high critical electric field, and superior thermal conductivity.

Since SiC has very low dopant diffusivity, implanted dopant generally cannot be redistributed by annealing to modify its concentration distribution. To form a JTE in SiC, different implant doses into multiple spaced zones can be used to create a non-uniform implant profile extending away from a junction termination. Multiple implantation steps can, however, increase process cycle time and complexity as well as fabrication cost.

Use of an implant mask having a tapered thickness can provide a JTE doping profile with a graded junction depth and graded concentration extending away from the junction termination. Formation of a tapered mask, however, is difficult to control.

As an alternative, portions of the SiC can removed via etching to create a JTE. This approach also entails difficult process control, and over etching of the SiC is difficult to remedy. Moreover, though commonly used, Reactive Ion Etching (RIE) can leave residual material damage resulting in increased leakage currents and diminished blocking performance.

SUMMARY OF INVENTION

Some features of the invention arise from the realization that an effective, reproducible JTE implantation mask can be formed by etching of a mask layer to form a mask having steps of different thicknesses. The mask can be used during a single implant step to define a graded JTE. Features of the invention can be utilized to simplify the fabrication of, and improve the performance of, high-power semiconductor devices.

Accordingly, in one aspect, the invention features a semiconductor device that has a graded junction termination extension for a pn junction termination. In another aspect, the invention features a method for fabricating the device. The method includes providing a semiconductor layer having a pn junction, providing a mask layer adjacent to the semiconductor layer, etching the mask layer to form at least two laterally adjacent steps associated with different mask thicknesses and substantially planar step surfaces, and implanting a dopant species through the mask layer into a portion of the semiconductor layer adjacent to the termination of the pn junction. The semiconductor layer is annealed to activate at least a portion of the implanted dopant species to complete the graded junction termination extension.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
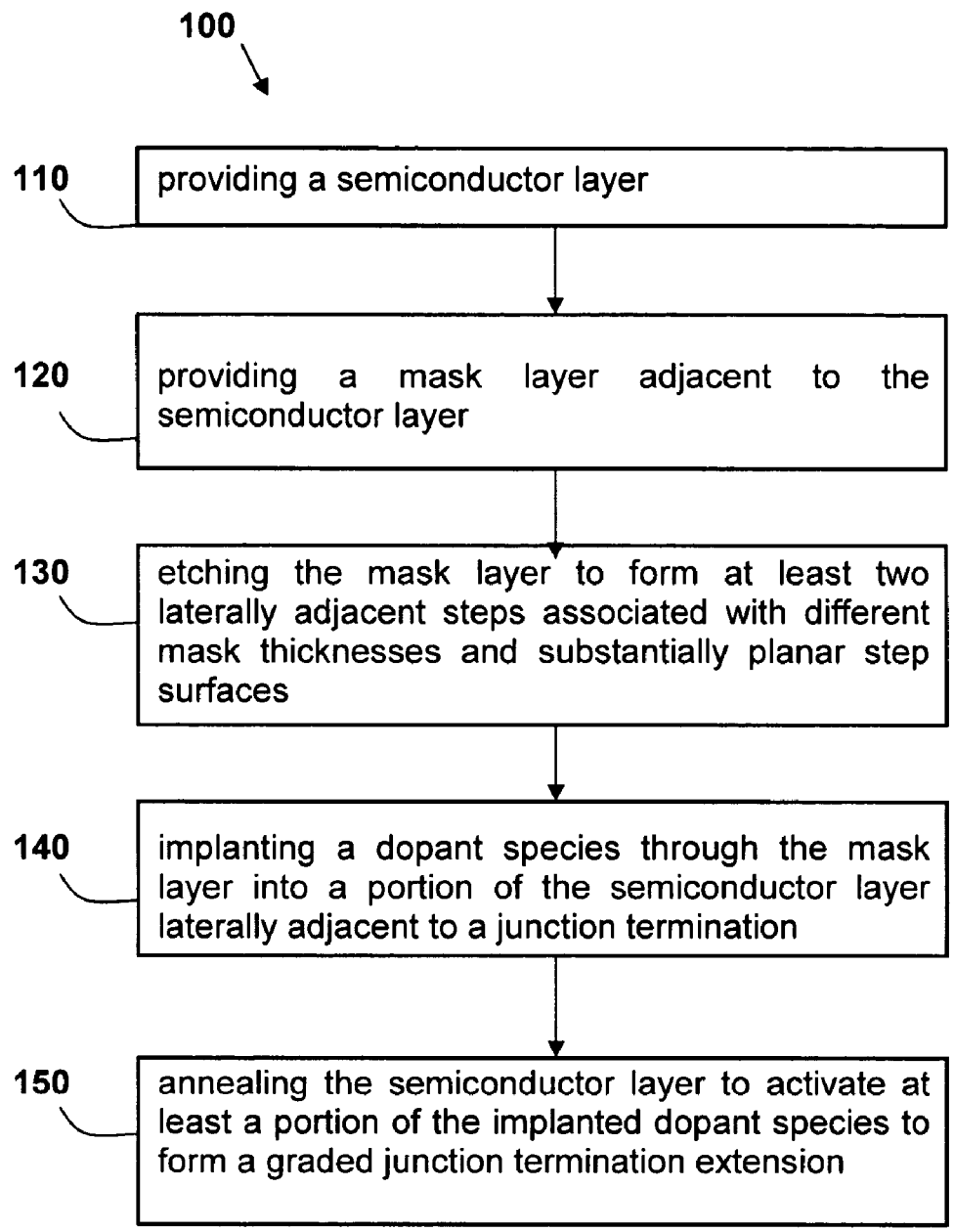
FIG. 1 is a flowchart of an embodiment of a method for fabricating a semiconductor device, according to principles of the invention.

FIG. 1 is a flowchart of a method 100 for fabricating a semiconductor device, according to one embodiment of the invention. The method 100 includes providing a semiconductor layer 110 that has a pn junction, as defined, for example by the presence of dopant materials in the semiconductor layer 110. The pn junction has a termination at an interface of the semiconductor layer 110.

The method 100 also includes providing a mask layer 120 adjacent to the semiconductor layer, etching 130 the mask layer to form at least two laterally adjacent steps associated with different mask thicknesses and substantially planar step surfaces, implanting 10 140 a dopant species through the mask layer into a portion of the semiconductor layer laterally adjacent to the junction termination, and annealing 150 the semiconductor layer to activate at least a portion of the implanted dopant species to form a graded termination extension for the junction termination.

The semiconductor layer 110 includes at least one semiconductor material. The semiconductor layer can include any suitable semiconductor material associated with relatively high diffusivity of dopant materials, including elemental or compound semiconductor materials such as Si, Ge, and GaAs. Alternatively, the semiconductor layer can be formed of a semiconductor material in which a diffusion coefficient of a dopant species is substantially less than a diffusion coefficient of the dopant species in silicon. Such materials include, for example, SiC and GaN.

The remainder of this Detailed Description refers to embodiments of the invention that utilize SiC. It should be understood that these embodiments are illustrative of some principles of the invention, and do not limit application of these principles to embodiments that utilize SiC.

The mask layer can include any material suitable for use as an implantation mask. Such materials include, for example, oxides of silicon. The remainder of this Detailed Description refers to embodiments of the invention that utilize masks formed from silicon dioxide ($SiO_2$). It should be understood that these embodiments are illustrative of some principles of the invention, and do not limit application of these principles to embodiments that utilize $SiO_2$ implantation masks.

As described below in more detail with reference to FIGS. 2a to 2d, etching 130 can include two or more etching steps to create two or more steps in a thinned area of the mask. A first etch step can provide, for example, a final thickness for one step, and partial thinning for one or more additional steps. A second etch step can then provide the final thickness for a second step, and can further thin remaining steps. In this manner two or more steps of desired thicknesses and widths can be produced. As will be understood by one having ordinary skill in the semiconductor device fabrication arts, a second mask material deposited on the mask layer can be used to define regions of the mask layer that are to be thinned by etching 130.

Alternatively, each step in the mask layer can be separately thinned by etching to obtain each step's final thickness. It will be apparent to one having ordinary skill in the semiconductor device fabrication arts that numerous variations in the above-described etching sequences can be utilized to produce the steps in a mask layer.

Thus, the laterally adjacent steps can be formed in stages via two or more etching steps. The mask layer can be reduced in thickness via any suitable technique, such as RIE, sputtering, and wet chemical etching.

Implanting 140 can entail implanting one or more doses of the dopant species, and can include implanting more than one dopant species, and can include non-dopant materials. For example, a first dose at a first energy and a second dose at a second energy can provide a more uniform distribution of the implanted material through a portion of the semiconductor layer extending away from the mask layer. The dopant species can be implanted at a dose in a range of, for example, about $10^{12}/cm^2$ to about $10^{14}/cm^2$.

The dopant species can include one or more of any species suitable as a dopant for the semiconductor layer. For example, for a semiconductor layer formed of SiC, the dopant species can be B, Al, Ga, In, P, or As.

Where the implanted dopant species has a relatively low diffusion coefficient, as is typically the case for a semiconductor layer formed from SiC, annealing 150 causes little or no diffusion of the implanted dopant species. In spite of the lack of diffusion, annealing 150 can provide sufficient rearrangement of atomic bonding of the implanted dopant species to electrically activate a significant portion of the implanted dopant. For example, for a dopant species implanted into SiC, annealing 150 can entail heating the semiconductor layer to a temperature of about 1500° C. to about 1800° C. for a period of-several minutes.

The method 100 can be employed to fabricate any device that may benefit from a graded JTE. Such devices include, for example, positive-intrinsic-negative (PIN) diodes, Schottky rectifiers, metal-oxide-semiconductor field-effect transistors (MOSFETs), bipolar junction transistors (BJTs), insulated gate bipolar transistors (IGBTs), thyristors, and other transistors and diodes, as described in more detail with reference to FIG. 3.

FIGS. 2a through 2d illustrate the fabrication of an embodiment of a semiconductor device, utilizing features of the method 100. FIGS. 2a through 2d are cross-sectional views of a portion of a PIN diode and related structures at various stages during fabrication of the PIN diode.

Figure 2A:
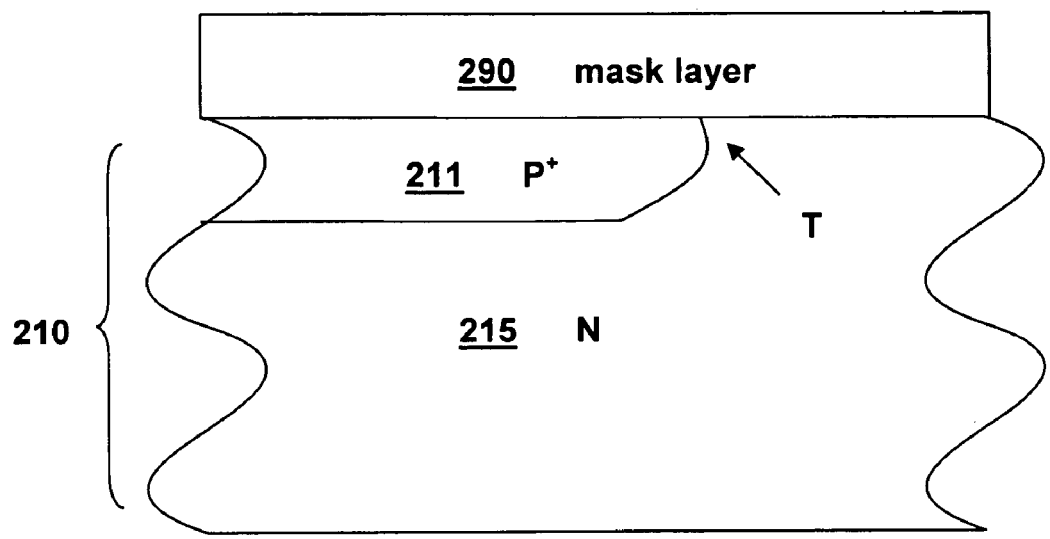
FIGS. 2a to 2d are a series of cross-sectional views of an embodiment of a semiconductor device at different stages of fabrication according to the method of FIG. 1.

In FIG. 2a, the unfinished diode includes a SiC layer 210 having a lightly doped n-type portion 215 and a heavily doped p-type portion 211. The n-type portion 215 provides a drift region for the PIN diode, while the p-type portion 211 provides an anode for the PIN diode. The pn junction defined by the p-type region 211 and the n-type region 215 has a junction termination T where the pn junction meets a surface of the semiconductor layer 210.

A mask layer 290, formed from $SiO_2$, has been deposited on the surface of the SiC layer 210. The oxide can be deposited by any suitable method, including, for example, methods known in the semiconductor processing industry.

The SiC layer 210 can be provided by a 4H—SiC wafer having a heavily doped n-type substrate on which a relatively lightly doped n-type epitaxial layer is grown to provide the n-type region 215. The heavily doped substrate can have a doping concentration, for example, of about $10^{19}/cm^3$ and a thickness of about 400 μm. The epitaxial layer can have a doping concentration, for example, of about $10^{15}/cm^3$, and a thickness, for example, of about 40 μm.

Although the p-type portion 211 is illustrated in FIG. 2a, the p-type portion 211 can be formed after formation of the JTE. The p-type portion 211 can be formed, for example, by implanting Al and/or B at temperatures above room temperature.

For example, multiple doses of Al can be implanted at about 800° C., and at energies in a range of about 30 keV to about 180 keV, with a total dose of about $3\times10^{15}/cm^2$ to provide a shallow zone of high concentration p-type material that facilitates a low contact resistance. A series of B implants at, for example, about 650° C. and energies in a range of about 25 keV to about 300 keV, and having a total dose of about $3\times10^{14}/cm^2$ can provide a box-shaped B implant profile that defines the metallurgical location of the pn junction in cooperation with the n-type dopant in the n-type portion 215.

Figure 2B:
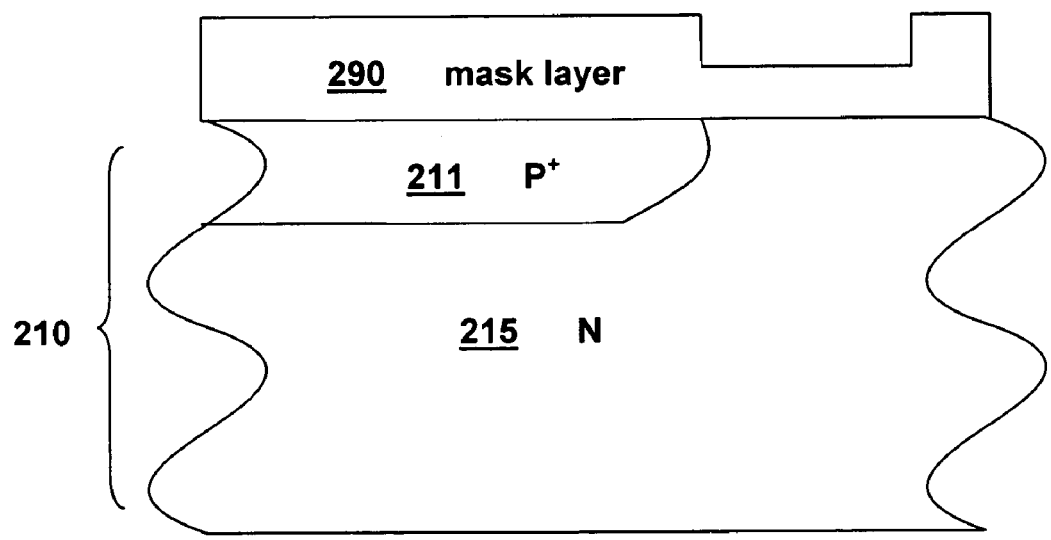

In FIG. 2b, an area of the mask layer 290 has been reduced in thickness by etching. Any suitable etching method can be employed to thin the mask layer 290. Such methods include, for example, RIE, wet chemical etching, and ion-beam etching. The area is etched to provide a final thickness for one of the desired laterally arranged steps being formed in the mask layer 290.

To selectively etch the area of the mask layer 290 while leaving other portions of the mask layer untouched 290, an additional mask can be deposited on the $SiO_2$ mask layer 290. The additional mask layer can include a window to expose the portion of the oxide mask layer 290 to be removed. After etching of the $SiO_2$ mask layer 290, the additional mask on the oxide mask layer 290 can be removed, as indicated by its absence in FIG. 2b.

Figure 2C:
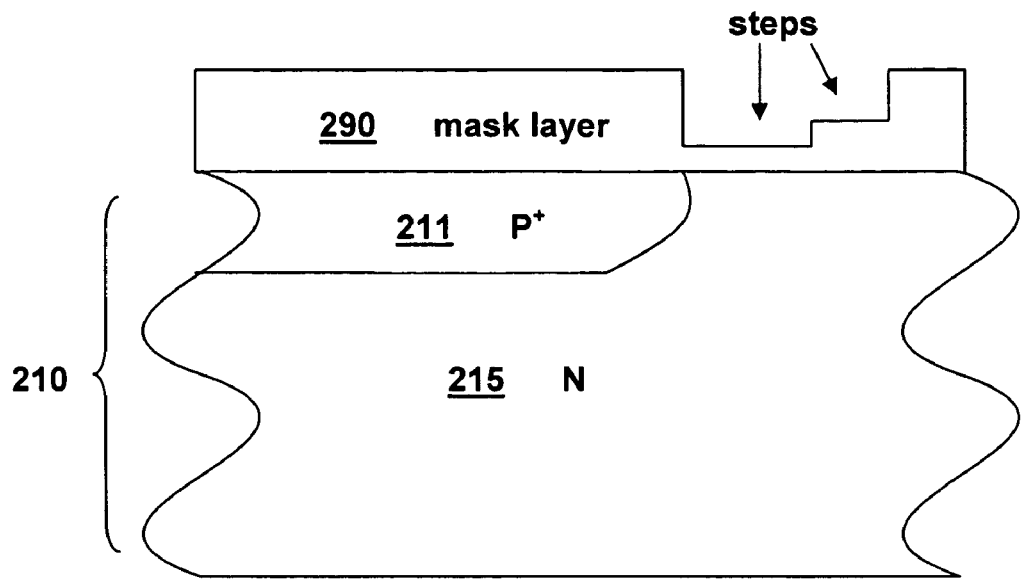

This first etching step in this example embodiment defines the lateral extent of the graded JTE that is to be formed. In FIG. 2c, a further portion of the mask layer 290 has been removed by a second etching step. An additional mask on the oxide mask layer 290 can be used to define the area to be etched for the second etch process. Here, only a portion of the originally thinned region has been further thinned to complete a second step in the oxide mask layer 290. The width of the two steps in this example is about 30 μm each. More generally, step widths can be chosen to support production of a desired implant profile extending laterally from the junction termination. The widths of the steps need not be identical.

Additional steps having a range of thicknesses, and widths, can be produced in a similar manner. The oxide thickness of each step can have a value as small as zero and as large as the thickness of the oxide as deposited.

In the example of FIGS. 2a through 2d, one or more dopant species can be implanted through the two steps formed in the SiO$_2$ mask layer 290 to provide a graded JTE associated with two regions of the SiC layer 210 having two different doping levels. Additional steps can be formed in the mask layer 290 to provide a more gradually stepped doping concentration gradient moving away from the junction termination.

Figure 2D:
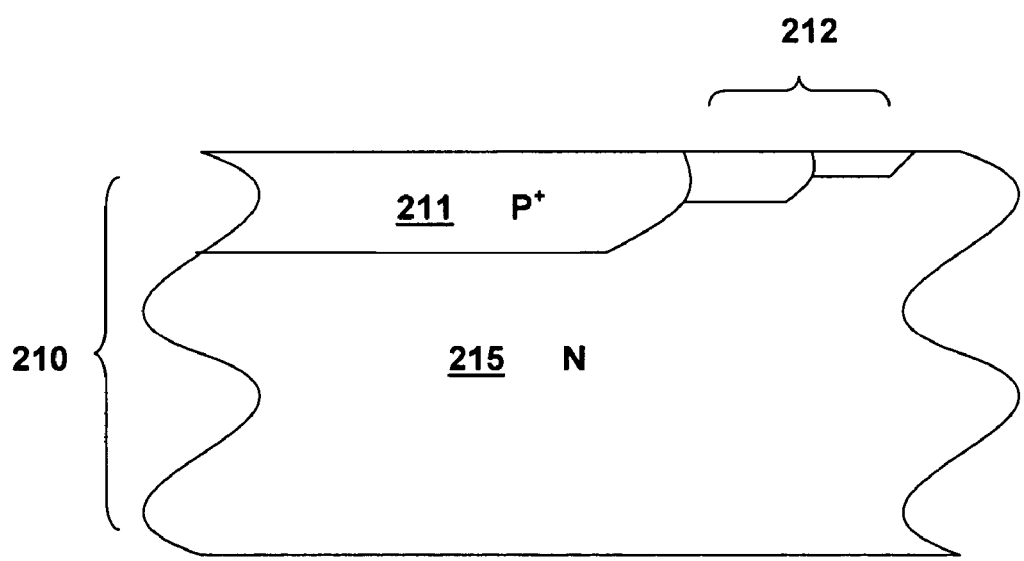

In FIG. 2d, a boron dopant species has been implanted through the steps into the semiconductor layer 210, in a region adjacent to the pn junction termination, and the mask layer 290 has been removed. As indicated, the thinner step has provided a greater concentration of implanted boron, which also has a deeper range than the depth of the implant through the thicker step. Portions of the semiconductor layer 210 masked by the full thickness of the oxide mask layer 290 received substantially no boron during the implant.

The boron can be implanted in a single implant, with the steps in the mask layer 290 causing an effective gradation in the doping level along the JTE. For example, once the mask layer 290 has been completed, boron can be implanted at a temperature of about 650° C. and a dose in a range of, for example, about $0.1 \times 10^{13}/cm^2$ to about $5 \times 10^{13}/cm^2$. The implant energy can be selected from a range of, for example, about 25 keV to about 300 keV.

It should be understood that the specific materials and process steps described above are intended to illustrate some principles of the invention, and not to limit application of the invention to any particular materials, structures, and/or fabrication steps.

Figure 3:
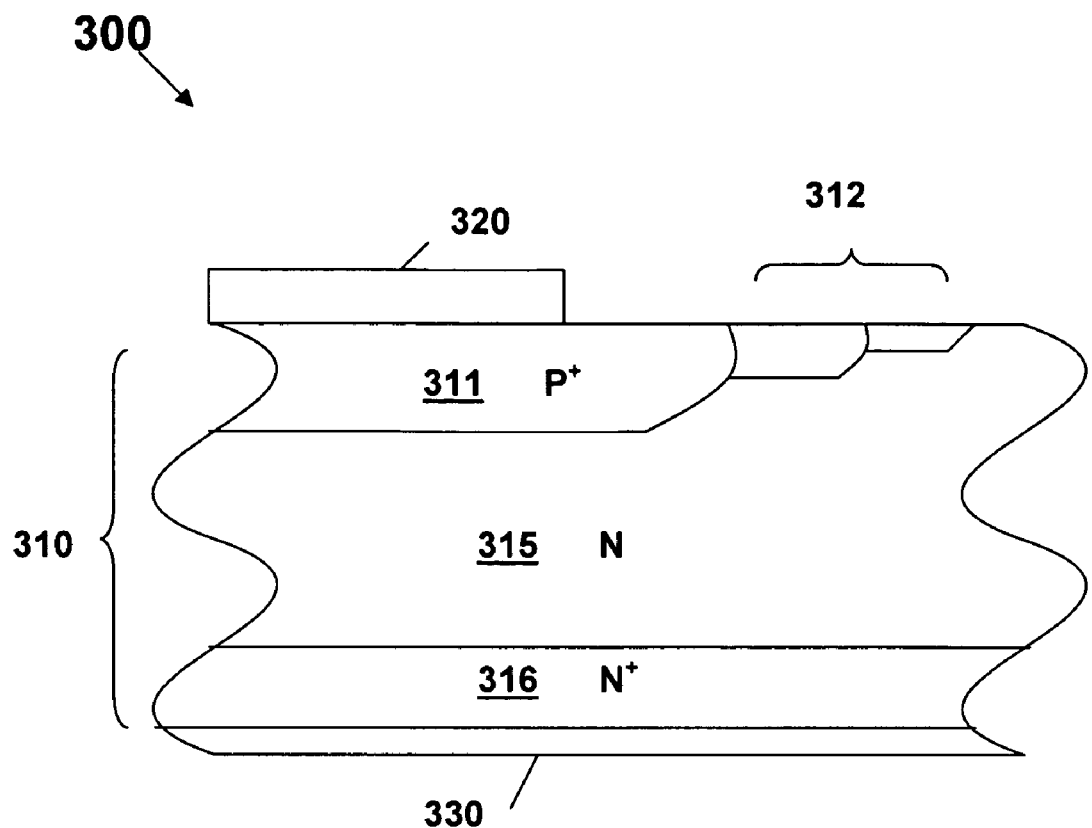
FIG. 3 is a cross-sectional view of an embodiment of a semiconductor device, according to principles of the invention.

FIG. 3 is cross-sectional view of a portion of an embodiment of a device 300, according to some principles of the invention. The device 300 can be fabricated by the method 100 described above. The device 300 includes a PIN diode. It will be understood by one having ordinary skill in the semiconductor device arts that features of the device 300 can be implemented in many other semiconductor devices, such as power MOSFETs, IGBTs, bipolar transistors, and thyristors.

The device 300 includes a SiC layer 310 having a lightly doped n-type portion 315, a heavily doped p-type portion 311, a heavily doped n-type substrate portion 316, a cathode contact 316 attached to the n-type substrate portion 316, an anode contact 320 contacting the p-type portion 311, a cathode contact 330 contacting the n-type portion 316, and a graded JTE portion 312 adjacent to the junction termination associated with the p-type portion 311. The n-type portion 315 provides a drift region for the PIN diode. The pn junction defined by the p-type region 311 and the n-type region 315 has a junction termination where the pn junction meets a surface of the semiconductor layer 310. The graded JTE portion 312 is.

The graded JTE portion 312 in this example has two zones, which can be fabricated, for example, as described above with reference to FIGS. 2a to 2d. The implant depths and implant concentrations of the two zones are different from one another, and provide a decreasing depth and concentration gradation of the JTE with increasing distance from the termination of the junction.

Some alternative embodiments of a device include more than two zones in a JTE. One embodiment includes a four-zone JTE, having a total width of 150 μm.

This invention is not limited in its application to the details of construction and the arrangement of components set forth in the description herein or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for fabricating a semiconductor device, comprising:
    providing a semiconductor layer having a pn junction that terminates at a surface of the semiconductor layer;
    providing a mask layer adjacent to the semiconductor layer;
    etching the mask layer to form at least two laterally adjacent steps associated with different mask thicknesses and substantially planar step surfaces;
    implanting a dopant species through the mask layer into a portion of the semiconductor layer adjacent to the termination of the pn junction; and
    annealing the semiconductor layer to activate at least a portion of the implanted dopant species to form a graded termination extension of the termination of the pn junction.

2. The method of claim 1, wherein a diffusion coefficient of the dopant species in the semiconductor layer is substantially less than a diffusion coefficient of the dopant species in silicon.

3. The method of claim 2, wherein the semiconductor layer comprises SiC.

4. The method of claim 1, wherein implanting comprises implanting a single dose of the dopant species to fully define the graded termination extension.

5. The method of claim 1, wherein annealing comprises heating the semiconductor layer without causing substantial diffusion of the implanted dopant species.

6. The method of claim 1, wherein etching comprises:
    etching an area of the mask layer associated with the at least two laterally adjacent steps to reduce a thickness of the area; and etching a portion of the area of the mask layer associated with one of the at least two laterally adjacent steps, to further reduce a thickness of the etched portion to a final thickness associated with the one step.

7. The method of claim 1, wherein etching comprises:
etching a first area of the mask layer associated with a first step of the at least two laterally adjacent steps to reduce a thickness of the first area; and
simultaneously etching the first area and a second area of the mask layer associated with a second step of the at least two laterally adjacent steps, to reduce a thickness of the second area, and to further reduce the thickness of the first area.

8. The method of claim 1, wherein the mask layer comprises silicon dioxide.

9. The method of claim 1, wherein etching the mask layer comprises removing a portion of the mask layer via a technique selected from the group consisting of reactive-ion etching, sputtering, and wet chemical etching.

10. The method of claim 1, wherein implanting comprises implanting at least two doses of the dopant species, each dose associated with a different energy.

11. The method of claim 10, wherein the different energies are selected to provide a substantially uniform dopant-species concentration profile through a thickness of a portion of the semiconductor layer extending away from the mask layer.

12. The method of claim 1, wherein the dopant species comprises at least one element selected from the group consisting of B, Al, Ga, In, P, and As.

13. The method of claim 1, wherein implanting comprises implanting about $10^{12}/cm^2$ to about $10^{14}/cm^2$ of the dopant species.

14. The method of claim 1, wherein providing the mask layer comprises depositing a mask material by a technique selected from the group consisting of evaporation, sputtering, and chemical vapor deposition.

15. The method of claim 1, wherein annealing comprises heating the semiconductor layer to a temperature of about 1500° C. to about 1800° C.

16. The method of claim 1, wherein the semiconductor device comprises a diode.

17. A method for fabricating a semiconductor device, comprising:
providing a semiconductor layer having a pn junction that terminates at a surface of the semiconductor layer;
providing a mask layer adjacent to the semiconductor layer;
etching the mask layer to form at least two laterally adjacent steps associated with different mask thicknesses and substantially planar step surfaces; and
implanting a dopant species through the mask layer into a portion of the semiconductor layer adjacent to the termination of the pn junction.

* * * * *

UNITED STATES PATENT AND TRADEMARK OFFICE
CERTIFICATE OF CORRECTION

PATENT NO.        : 7,144,797 B2  
APPLICATION NO. : 10/949982  
DATED               : December 5, 2006  
INVENTOR(S)      : Chow et al.

It is certified that error appears in the above-identified patent and that said Letters Patent is hereby corrected as shown below:

In column 1, line 21, please replace "can exhibit 15 relatively low" with -- can exhibit relatively low -- ;

In column 2, line 62, please replace "implanting 10 140 a dopant" with -- implanting 140 a dopant -- .

Signed and Sealed this

Thirteenth Day of March, 2007

JON W. DUDAS  
*Director of the United States Patent and Trademark Office*